(12) United States Patent
Kim (10) Patent No.: US 11,990,449 B2
(45) Date of Patent: May 21, 2024

(54) DUAL RDL STACKED DIE PACKAGE USING VERTICAL WIRE

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 865 days.

(21) Appl. No.: 16/247,328

(22) Filed: Jan. 14, 2019

(65) Prior Publication Data

US 2020/0227386 A1     Jul. 16, 2020

(51) Int. Cl.
*H01L 25/065*     (2023.01)
*H01L 25/00*     (2006.01)
*H01L 25/10*     (2006.01)

(52) U.S. Cl.
CPC ........ *H01L 25/0657* (2013.01); *H01L 25/105* (2013.01); *H01L 25/50* (2013.01); *H01L 2225/0651* (2013.01); *H01L 2225/06562* (2013.01); *H01L 2225/06586* (2013.01); *H01L 2225/1041* (2013.01); *H01L 2225/1058* (2013.01)

(58) Field of Classification Search
CPC ... H01L 25/0657; H01L 25/105; H01L 25/50; H01L 2225/0651; H01L 2225/06562; H01L 2225/06586; H01L 2225/1041; H01L 2225/1058; H01L 2225/1035; H01L 24/19; H01L 24/20; H01L 2224/18; H01L 2224/24146; H01L 2224/32145; H01L 2224/33181; H01L 2224/73217; H01L 2224/73267; H01L 2224/95
See application file for complete search history.

(56) References Cited

U.S. PATENT DOCUMENTS

| | | | |
|---|---|---|---|
| 11,171,076 B2* | 11/2021 | Yu | H01L 23/3677 |
| 2010/0244208 A1* | 9/2010 | Pagaila | H01L 23/50 |
| | | | 257/659 |
| 2010/0265751 A1* | 10/2010 | Hong | H05K 3/284 |
| | | | 257/E23.141 |

(Continued)

*Primary Examiner* — Kyoung Lee
*Assistant Examiner* — Christina A Sylvia
(74) *Attorney, Agent, or Firm* — Schwabe, Williamson & Wyatt, P.C.

(57) ABSTRACT

Embodiments include a semiconductor package, a package on package system, and a method of forming the semiconductor package. The semiconductor package includes a first redistribution layer, a stack of dies on the first redistribution layer, a second redistribution layer over the stack of dies and the first redistribution layer, and a plurality of interconnects coupled to the stack of dies and the first and second redistribution layers. The interconnects may extend substantially vertical from a top surface of the first redistribution layer to a bottom surface of the second redistribution layer. The semiconductor package may also include a mold layer between the first redistribution layer and the second redistribution layer. The plurality of interconnects may be through mold vertical wire interconnects. The first and second redistribution layers may be dual-sided redistribution layers. The semiconductor package may further include adhesive layers coupled to the stack of dies.

10 Claims, 11 Drawing Sheets

(56) References Cited

U.S. PATENT DOCUMENTS

| | | | |
|---|---|---|---|
| 2012/0038064 A1* | 2/2012 | Camacho | H01L 24/81 257/E23.141 |
| 2015/0287700 A1* | 10/2015 | Yu | H01L 25/0657 257/777 |
| 2016/0093572 A1* | 3/2016 | Chen | H01L 23/5389 438/126 |
| 2017/0018476 A1* | 1/2017 | Wang | H01L 25/105 |
| 2017/0194290 A1* | 7/2017 | Yu | H01L 25/0655 |
| 2017/0221859 A1* | 8/2017 | Chen | H01L 21/78 |
| 2018/0012862 A1* | 1/2018 | Yu | H01L 21/76877 |
| 2018/0026022 A1* | 1/2018 | Lee | H01L 23/5386 257/659 |
| 2018/0096946 A1* | 4/2018 | Meyers | H01L 21/563 |
| 2018/0211936 A1* | 7/2018 | Chang | H01L 24/96 |
| 2018/0211943 A1* | 7/2018 | Song | H01L 25/03 |
| 2019/0221543 A1* | 7/2019 | Sung | H01L 23/49822 |
| 2020/0020638 A1* | 1/2020 | Heo | H01L 23/5383 |
| 2020/0381397 A1* | 12/2020 | Yu | H01L 21/78 |

\* cited by examiner

DUAL RDL STACKED DIE PACKAGE USING VERTICAL WIRE

FIELD

Embodiments relate to packaging semiconductor devices. More particularly, the embodiments relate to a stacked die package using dual-sided redistribution layers (RDLs) and vertical wires.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. In addition, the data center memory storage market is forecasting more data and higher capacity storage solutions, where 3D NAND memory packages are typically considered a key ingredient to meet these big data demands.

To meet these every-growing demands, manufacturers are developing more memory cell layers and double-digit stacked die package solutions. These stacked die packaging solutions, however, encounter several challenges. One main challenge of double-digit stacked die packages is the decreased yield. For example, when a back-end yield of a single die package is nearing maximum capacity, the die back-end component yield may be reduced in half as such significant yield loss related cost is typically expected.

Another challenge involves the low yield of the high stacked die package which typically causes one to roughly two quarter schedule push to reach acceptable product maturity levels. Furthermore, one major challenge includes significantly high costs to assemble and test double-digit stacked die packages. Lastly, another challenge for these current monolithic die stacked assembly packages is the requirement of longer testing and assembly staging time.

Accordingly, existing solutions may include stacking multiple ultra-thin vertical wire packages, such as a package in package (PiP) configuration, to overcome this high yield challenge. These vertical wire packages typically use wire bonds to connect package to package or package to substrate. This packaging, however, led to an increased package size and a lowered signal integrity margin in high speed applications due to the long wire bond lengths. In addition, once these packages are assembled, no testing or designing rework of such packages is allowed.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages that include stacked die packages, dual-sided redistribution layers (RDLs), and vertical wires, and methods of forming such semiconductor packages. As described herein, a "dual-sided RDL" may refer to a redistribution layer that may be conductively coupled other components (e.g., additional electronic components, packages, substrates, dies, solder balls, etc.) above the top surface and below the bottom surface of the redistribution layer. For some embodiments, the semiconductor packages include dual-sided RDLs that are disposed above and below vertical wire quad-die packages (QDP) packages (or vertical wire multi-die stacked packages). Embodiments of the semiconductor packages implement substantially thin vertical wires (e.g., thin through mold vertical wires/interconnects) to couple dual-sided RDLs and multi-die stacked packages, which thus enable package on package (PoP) integration by coupling signals between the top and bottom multi-die/memory packages.

These embodiments improve packaging solutions by reducing the overall footprint, enhancing electrical performance, and decreasing signal loss of the semiconductor packages—as compared to existing solutions. Furthermore, the embodiments described herein enable rework (e.g., design modifications, component/package replacements, etc.) of the semiconductor packages by having a PoP configuration. Such PoP configuration provides multi-die stacked packages coupled to dual-sided RDLs and vertical wires using solder balls, this therefore enables an improved signal integrity margin as long wires (e.g., wire bond interconnects) are no longer needed to couple the packages to the substrates. Additionally, the semiconductor packages enhance packaging solutions by (i) providing stacked multiple pre-tested dual-sided RDLs with stacked die packages using vertical wire technology, (ii) increasing the input/output (I/O) count, (iii) lowering power loss, (iv) heightening the overall yield due to pre-tested QDP stacks, and/or (v) optionally facilitating component(s) mount above the stacked packages.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including package substrates having a stack of dies, dual-sided RDLs, and a plurality of interconnects such as the through mold vertical wires.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1A:
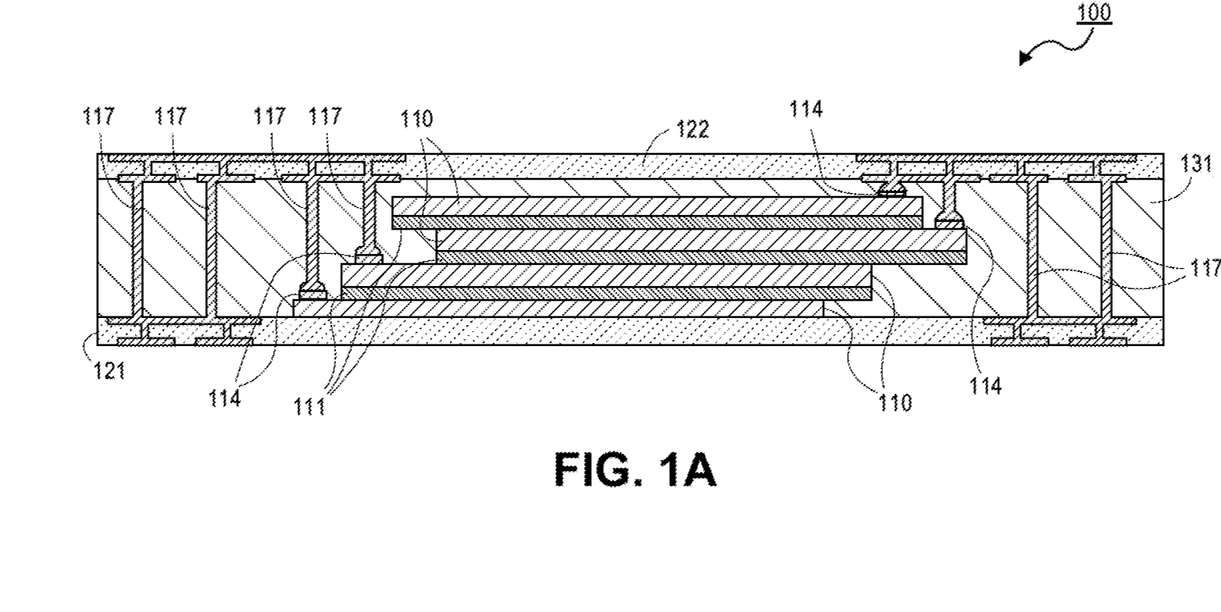
FIG. 1A is a cross-sectional view of a semiconductor package with a stack of dies, dual-sided redistribution layers (RDLs), and a plurality of interconnects, according to one embodiment.
Figure 1B:
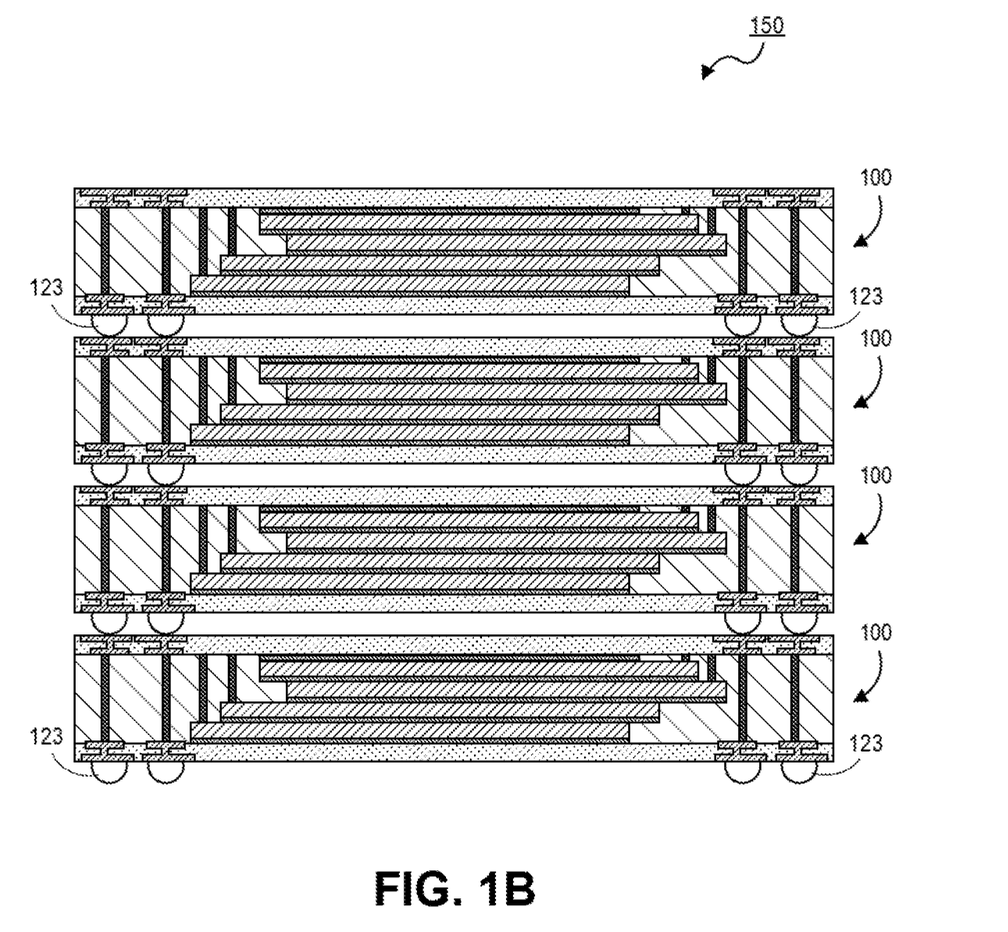
FIG. 1B is a cross-sectional view of a package on package (PoP) with a plurality of stacked semiconductor packages and a plurality of solder balls, according to one embodiment.
Figure 1C:
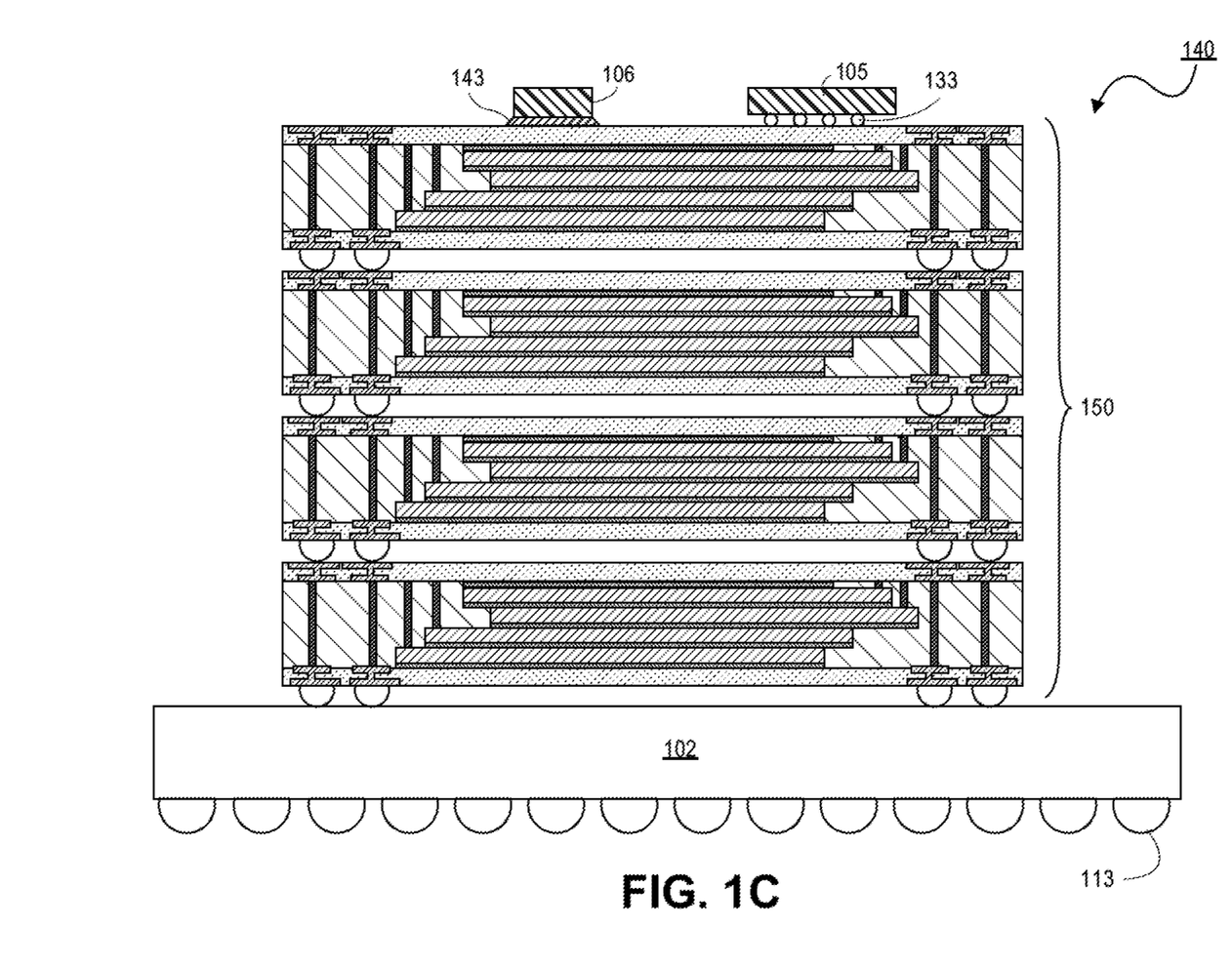
FIG. 1C is a cross-sectional view of a PoP system with a plurality of stacked semiconductor packages, a plurality of solder balls, and a substrate, where one or more electronic components are disposed above the stacked semiconductor packages, according to one embodiment.

FIG. 1A is a cross-sectional view of a semiconductor package 100 with a stack of dies 110, RDLs 121-122, and a plurality of interconnects 117, according to one embodiment. FIG. 1B is a cross-sectional view of a PoP 150 with the plurality of stacked semiconductor packages 100 coupled by a plurality of solder balls 123, according to one embodiment. FIG. 1C is a cross-sectional view of a PoP system 140 with the plurality of stacked semiconductor packages 100, the plurality of solder balls 123, and a substrate 102, where one or more components 105-106 are disposed above the PoP 150, according to one embodiment.

Referring back to FIG. 1A, the semiconductor package 100 includes a stack of dies 110 disposed between a RDL 121 and a RDL 122. For one embodiment, the stacked dies 110 may include, but are not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). As described herein, a "stack of dies" (or stacked dies) may refer to two or more dies that are stacked on top of each other.

For one embodiment, the RDLs 121-122 may be dual-side RDLs that may be conductively coupled to other packages and/or electronic components (e.g., dies, capacitors, etc.) above and below each of the RDLs 121-122 (e.g., as shown in FIGS. 1B-1C). In addition, the RDLs 121-122 may be used to couple the stacked dies 110 to another substrate (e.g., a printed circuit board (PCB)) by using a plurality of solder balls (e.g., as shown in FIG. 1C). The RLDs 121-122 may be formed of one or more conductive layers stacked on top of each other and coupled by one or more conductive vias. For example, the RDLs 121-122 may be disposed of alternating layers of organic build-up layers and conductive (e.g., Cu) routing layers and vias, as is known in the art. In one embodiment, the RDLs 121-122 may be formed by sputtering (or disposing/depositing) a conformal conductive layer(s), such as a layer of Cu, Ni, Sn, Au, Ag, Al, an Al alloy, W, Ti, Ta, TiN, TaN, or the like, using any suitable method, including evaporation, sputter, electroplating, printing, jetting, stud bumping, direct placement, or the like. Note that, the RDLs 121-122 may be substantially similar to each other, but in other embodiments the RDL 121 may be different from the RDL 122 based on the desired packaging design/application.

The stacked dies 110 may be disposed above the RDL 121 (or a first RDL), where the stacked dies 110 are coupled to each other using adhesive layers 111. For one embodiment, the adhesive layers 111 (or adhesive films) may be die attach tapes/films. In other embodiments, the adhesive layers 111 may be a ultra-violet (UV) releasable tapes/films, a double-sided release tapes, and/or any other type of adhesive tapes. In one embodiment, the dies 110 may be stacked on top of each other with an offset between each of the dies 110. In some embodiments, the bottommost die of the stacked dies 110 may be disposed directly on a top surface of the RDL 121. In another embodiment, the bottommost die of the stacked dies 110 may be coupled to the top surface of the RDL 121 by an adhesive layer. Additionally, in one embodiment, the topmost die of the stacked dies 110 may be coupled to a bottom surface of the RDL 122 by an adhesive layer.

As shown in FIG. 1A, the semiconductor package 100 disposes the RDL 122 (or a second RDL) above the stacked dies 110 and the RDL 121, where a mold layer 131 (or an encapsulation layer) is disposed between the RDLs 121-122 and surrounds the stacked dies 110. In one embodiment, the mold layer 131 may include an epoxy (e.g., a soft epoxy, a stiff epoxy, opaque epoxy, etc.) with one or more filler materials.

For some embodiments, the RDL 122 are coupled to the RDL 121 by the interconnects 117. In one embodiment, the interconnects 117 may be vertical wire interconnects, such as through mold vertical interconnects. The interconnects 117 may have substantially vertical outer sidewalls, which are not tapered, and may have a cylindrical shape, a spherical shape, an oval shape, or a similar shape. For example, the interconnects 117 may be ultra-thin vertical interconnects having a diameter of approximately 5 µm to 50 µm. In other embodiments, the interconnects 117 may have a diameter of approximately less than 5 µm. The interconnects 117 may be formed, but not limited to, cooper, gold, silver, and similar metals. In alternate embodiments, the interconnects 117 may include one or more different types of interconnects, such as molded vertical interconnects, wire bonded interconnects, wire interconnects, and/or ribbon interconnects.

In some embodiments, one or more of the interconnects 117 may be coupled to one of the stacked dies 110, where such interconnects 117 are coupled to conductive pads 114 on the top surfaces of the stacked dies 110. The conductive pads 114 may be located on one of the outer edges of the stacked dies 110 (i.e., the offsetting edges of the stacked dies 110). For example, the stacked dies 110 may have top surfaces with conductive pads 114 on the outer edges, and the interconnects 117 may extend from the conductive pads 114 to form ultra-thin, vertical columns/wires that are coupled to the RDL 122. In one embodiment, the interconnects 117 may have a thickness (or a z-height) of approximately 1 µm to 200 µm. In other embodiments, the interconnects 117 may have a thickness of approximately less than 1 µm. Note that, in some embodiments, the interconnects 117 may have one or more ends that are coupled directly to the conductive pads 114, where these ends may have a tapered end or a rounded end to facilitate coupling such interconnects 117 to the conductive pads 114 of the stacked dies 110.

Each of the stacked dies 110 may have a thickness of approximately 50 µm to 1 mm. For example, the semiconductor package 100 may be referred to as an ultra-thin vertical wire, multi-die package, which has a thickness of approximately less than 200 µm. Additionally, as described above, the semiconductor package 100 may be tested through a back-end test flow before the semiconductor package 100 is stacked into a PoP configuration (e.g., as shown in FIGS. 1A-1B), which enables higher yield and faster time to market. Note that the package substrate 100 may include any number of stacked dies based on the desired packaging design.

Referring now to FIG. 1B, the PoP 150 includes one or more package substrates 100 that are similar to the package substrates 100 of FIG. 1A, however the PoP 150 includes stacked package substrates 100 which are coupled to one another with solder balls 123. Note that the PoP 150 may include any number of stacked package substrates 100 based on the desired packaging design.

Referring now to FIG. 1C, the PoP system 140 may include one or more package substrates 100 that are similar to the package substrates 100 of FIG. 1A, however the PoP system 140 includes one or more components 105-106 disposed above the PoP 150 and may be coupled to a substrate 102. The components 105-106 may be any type of electronic devices, any type of discrete device, and/or any similar component. The components 105-106 may be disposed coupled to the top surface of the PoP 150 using solder balls 133 and an underfill layer 143 (or an adhesive layer), respectively. In addition, in alternate embodiments, the PoP system 140 may include one or more land side capacitors (LSCs) between the packages substrates of the PoP 150, if using LSCs with a smaller z-height than the solder balls that are separating the respective package substrates.

According to some embodiments, the PoP system 140 has the PoP 150 (or PoP package) disposed on a top surface of the substrate 102, where the substrate 102 may have a plurality of solder balls 113 that may be used to couple to another substrate. The package substrate 102 may include, but is not limited to, a substrate, a PCB, and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics, where each dielectric layer can be a photosensitive dielectric layer. For some embodiments, holes may be drilled in the PCB 102. For one embodiment, the PCB 102 may also include one or more conductive layers that are used to form traces, vias, pads, planes, and/or the like.

Note that each of the package substrates 100 and the PoP systems 140 and 150 as shown in FIGS. 1A-1C may include fewer or additional packaging components based on the desired packaging design.

FIGS. 2A-2L are cross-sectional views of a process flow to form a semiconductor package 200 with a stack of dies, dual-sided RDLs, and a plurality of interconnects, according to some embodiments. FIGS. 2A-2L are a series of cross-sectional illustrations that depict a process flow using a stacked die package with dual-sided RDLs and vertical wires to provide a high I/O count, a high test yield, and a low power loss, in accordance with an embodiment. In an embodiment, the semiconductor package 200 of FIGS. 2A-2L may be substantially similar to the semiconductor package 100 of FIG. 1A.

Figure 2A:
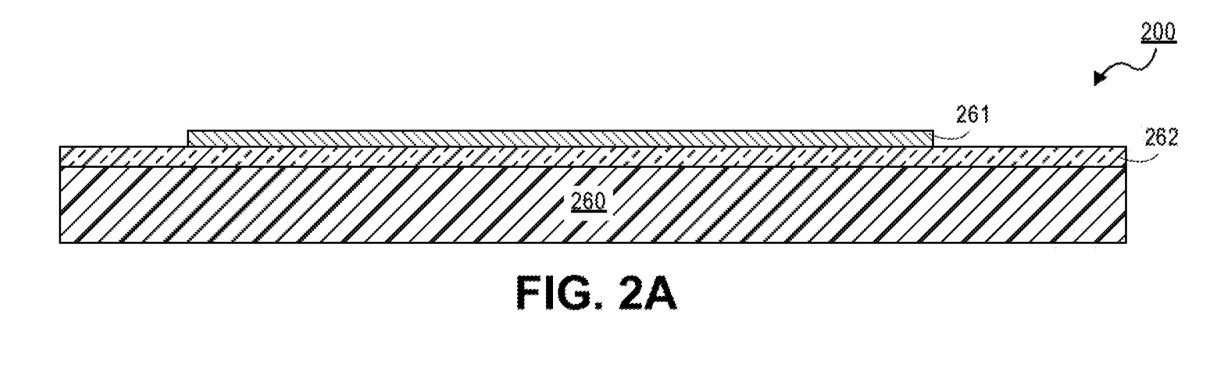
FIGS. 2A-2L are cross-sectional views of a process flow to form a semiconductor package with a stack of dies, dual-sided RDLs, and a plurality of interconnects, according to some embodiments.

Referring now to FIG. 2A, a cross-sectional illustration of a semiconductor package 200 with an adhesive layer 261, a conductive layer 262, and a carrier 260 (or a first carrier) is shown, in accordance with an embodiment. In one embodiment, the semiconductor package 200 may include the adhesive layer 261 and the conductive layer 262, respectively, disposed on the carrier 260. The conductive layer 262 may include one or more conductive materials, such as Al, Cu, Au, etc. For one embodiment, the adhesive layer 261 may be a UV releasable tape, a double-sided release tape/film, and/or any other type of adhesive tapes/films.

The adhesive layer 261 may be disposed above the carrier 260. The carrier 260 may be any rigid carrier, which can be made from glass, stainless steel, etc. In one embodiment, the adhesive layer 261 has a releasable adhesive side and a pressure sensitive adhesive side. For one embodiment, the adhesive layer 261 may have the releasable side disposed on the conductive layer 262, as the releasable side can be released subsequently using a simple UV or heat treatment.

Figure 2B:
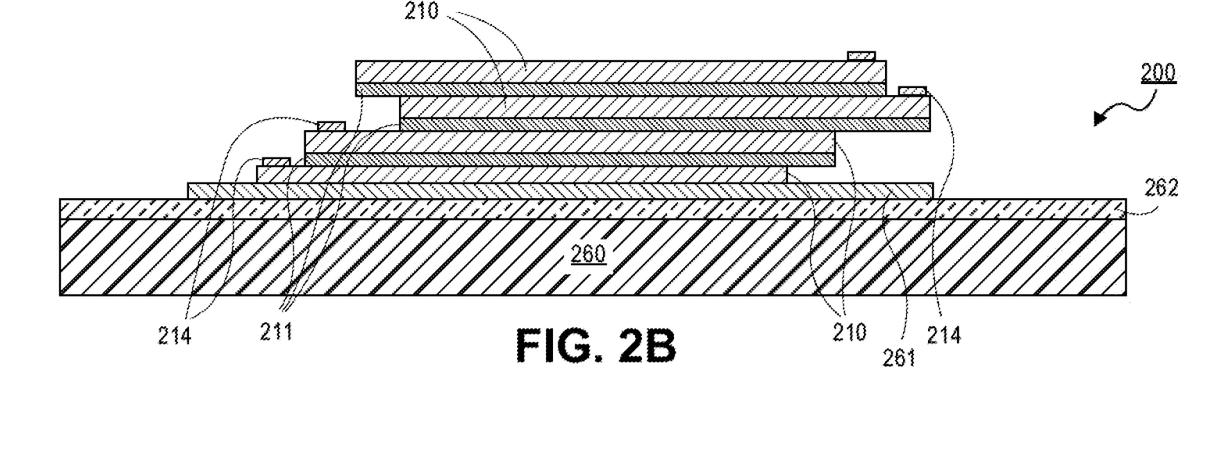

Referring now to FIG. 2B, a cross-sectional illustration of a semiconductor package 200 with a stack of dies 210 is shown, in accordance with an embodiment. In one embodiment, the semiconductor package 200 may include the stacked dies 210 that are disposed above the adhesive layer 261, the conductive layer 262, and the carrier 260, respectively. The stacked dies 210 are substantially similar to the stacked dies 110 of FIG. 1A. The stacked dies 210 are coupled to each other with a plurality of adhesive layers 211. The adhesive layers 211 (e.g., die attach films) may be substantially similar to the adhesive layers 111 of FIG. 1A. As shown in FIG. 2B, the stacked dies 210 have conductive pads 214 located on the outer edges of the stacked dies 210.

Figure 2C:
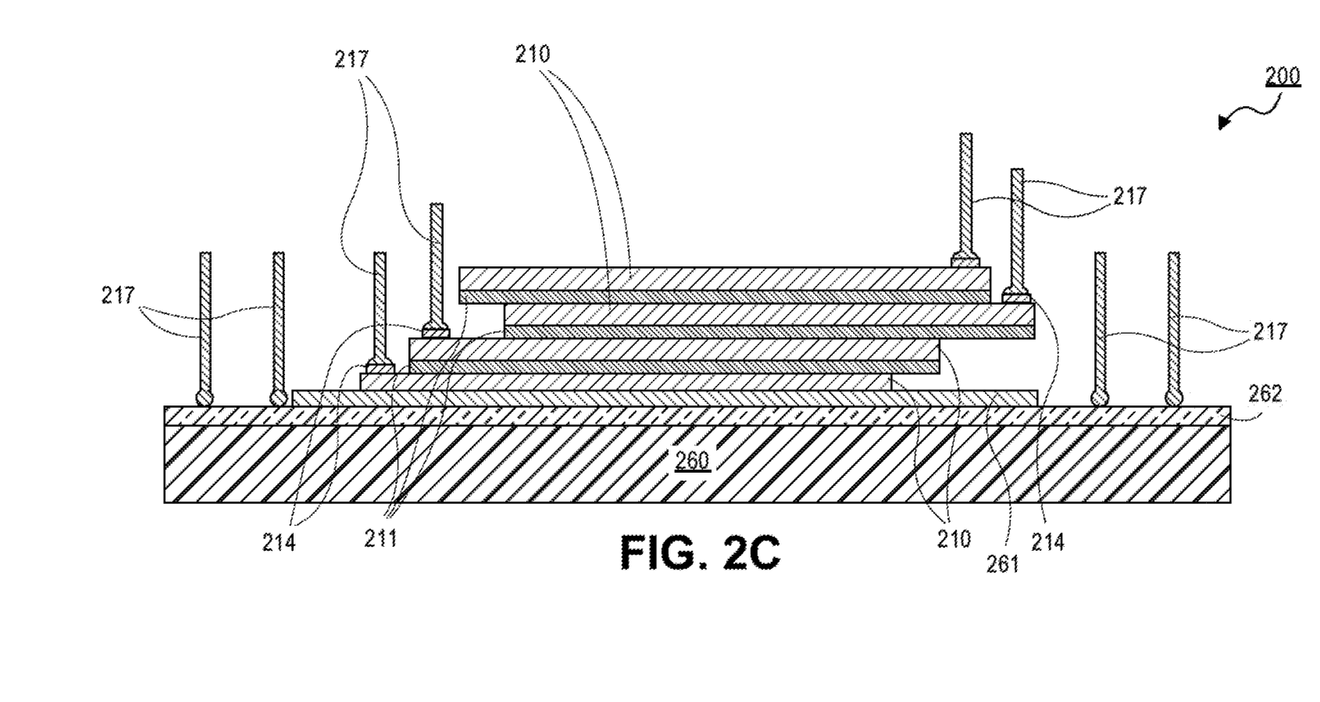

Referring now to FIG. 2C, a cross-sectional illustration of a semiconductor package 200 with a plurality of interconnects 217 is shown, in accordance with an embodiment. In one embodiment, the semiconductor package 200 may include the interconnects 217 that are disposed on the conductive pads 214 of the stacked dies 210. The interconnects 217 (or vertical wires) may be substantially similar to the interconnects 117 of FIG. 1A. The interconnects 217 may be formed with any suitable lithographic plating and patterning process (i.e., the interconnects 217 may be vertically grown to form these thin, vertical wire interconnects).

In some embodiments, the interconnects 217 may be disposed on the top surfaces of the conductive layer 262 and the conductive pads 214. The interconnects 217 may have solder balls (or solder bumps) on the bottom ends of the interconnects 217, which are used to couple the interconnects 217 to the conductive layer 262 and the conductive pads 214. In addition, the interconnects 217 may be initially formed with larger thicknesses (or z-heights), as such these interconnects 217 may subsequently be grinded to the desired thicknesses of the final semiconductor package (e.g., as shown in FIG. 2E).

Figure 2D:
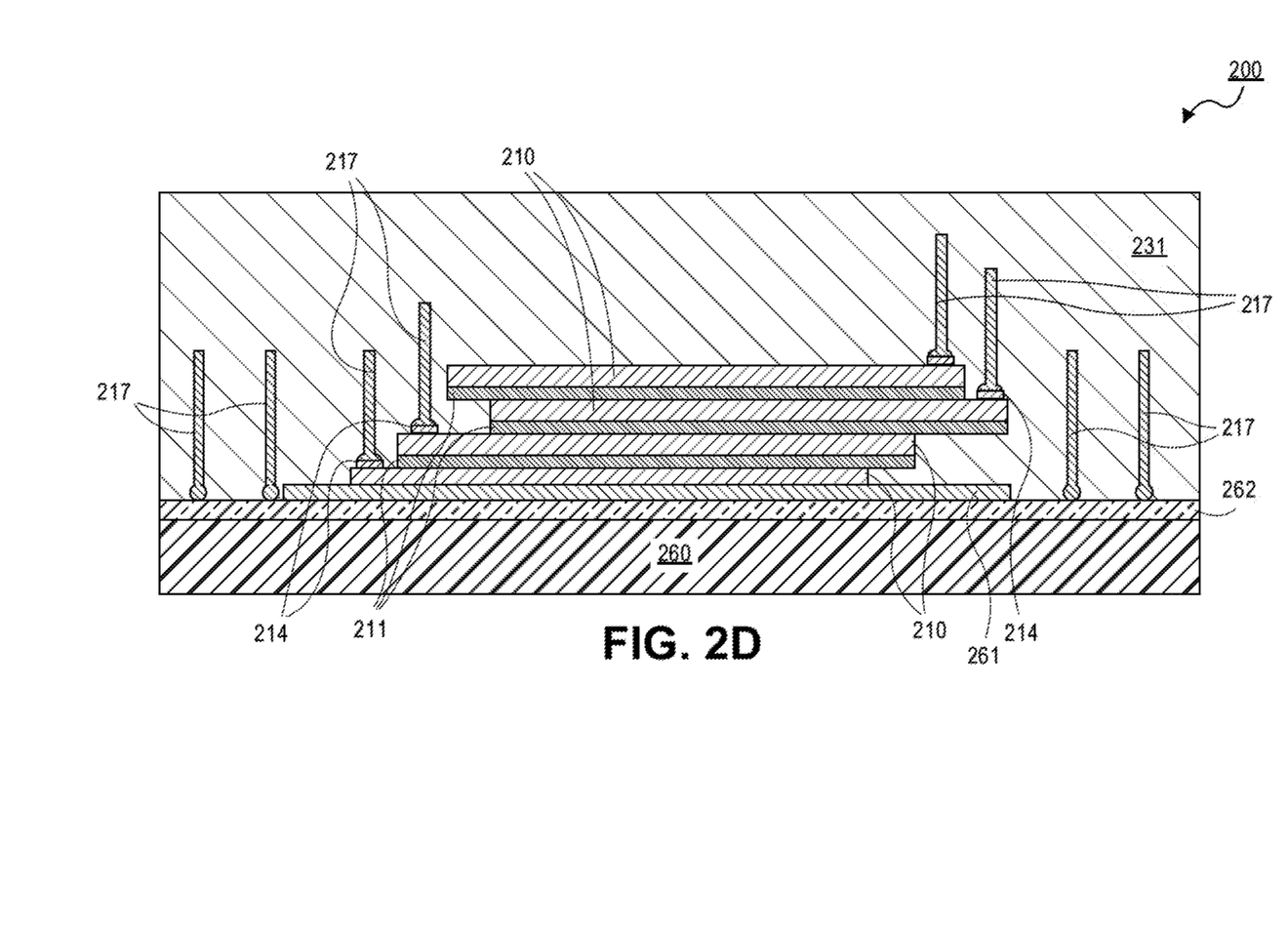

Referring now to FIG. 2D, a cross-sectional illustration of a semiconductor package 200 with a mold layer 231 is shown, in accordance with an embodiment. In one embodiment, the semiconductor package 200 may have the mold layer 231 disposed above the conductive layer 262. In this embodiment, the mold layer 231 is disposed above and around the interconnects 217, the stacked dies 210, and the adhesive layers 211 and 261. The mold layer 231 may be substantially similar to the mold layer 131 of FIG. 1A. The mold layer 231 may be formed using any suitable molding/encapsulating process.

Figure 2E:
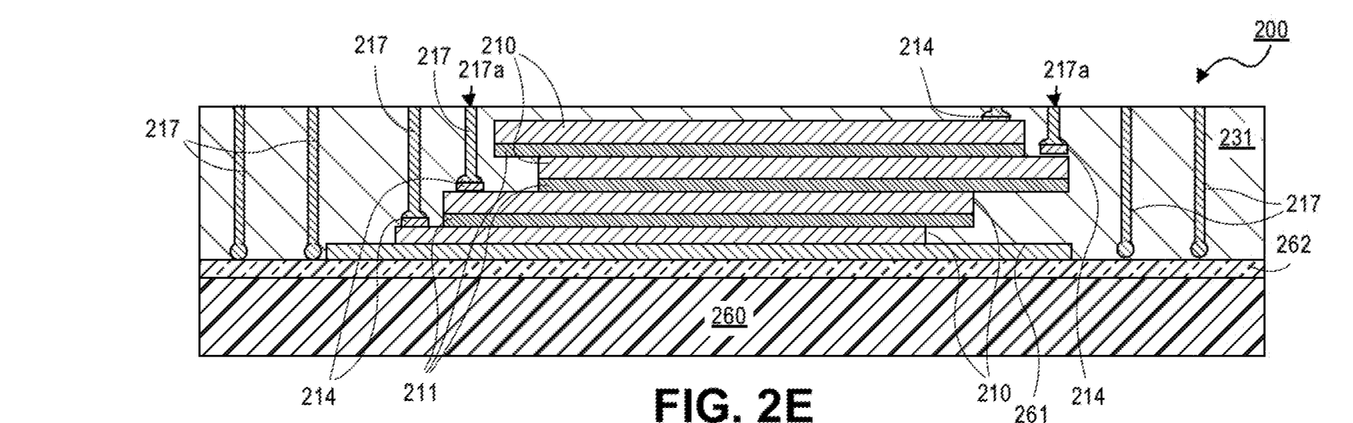

Referring now to FIG. 2E, a cross-sectional illustration of a semiconductor package 200 with top surfaces 217a of the interconnects 217 is shown, in accordance with an embodiment. In one embodiment, the semiconductor package 200 may include grinding the mold layer 231 and the interconnects 217 to a desired thickness. This mold grinding process may reveal the top surfaces 217a of the interconnects 217.

Figure 2F:
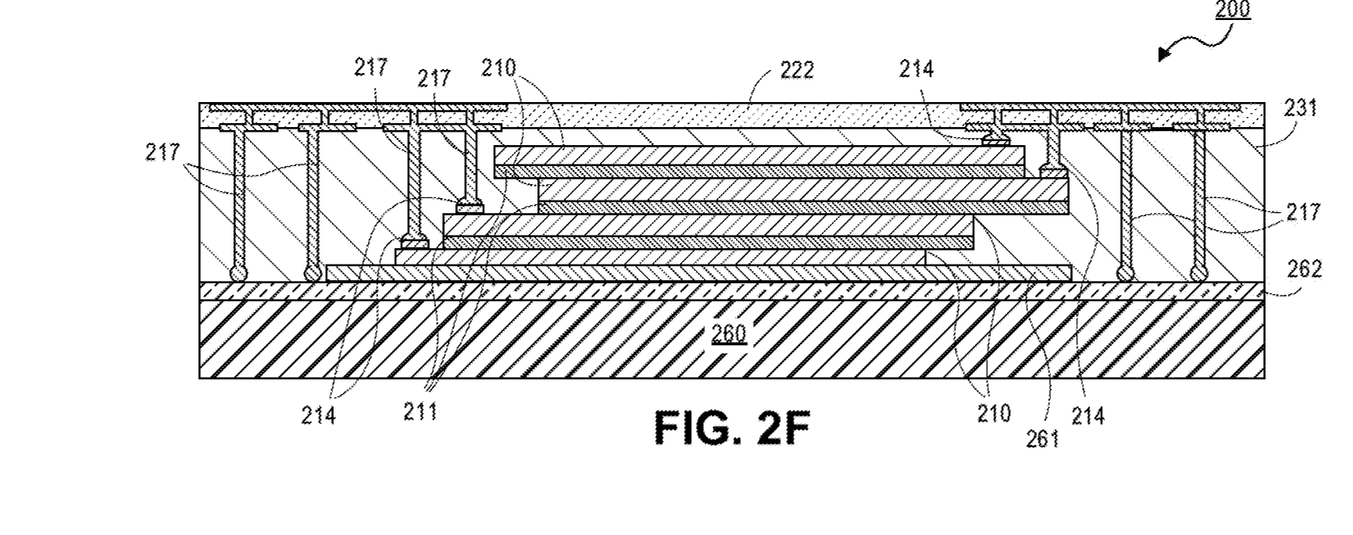

Referring now to FIG. 2F, a cross-sectional illustration of a semiconductor package 200 with a RDL 222 is shown, in accordance with an embodiment. In one embodiment, the semiconductor package 200 may include the RDL 222 disposed above the interconnects 217 and the mold layer 231. The RDL 222 may be substantially similar to the RDL 122 of FIG. 1A. In one embodiment, the RDL 222 is electrically coupled to the interconnects 217 and the conductive pads 214 of the stacked dies 210.

Figure 2G:
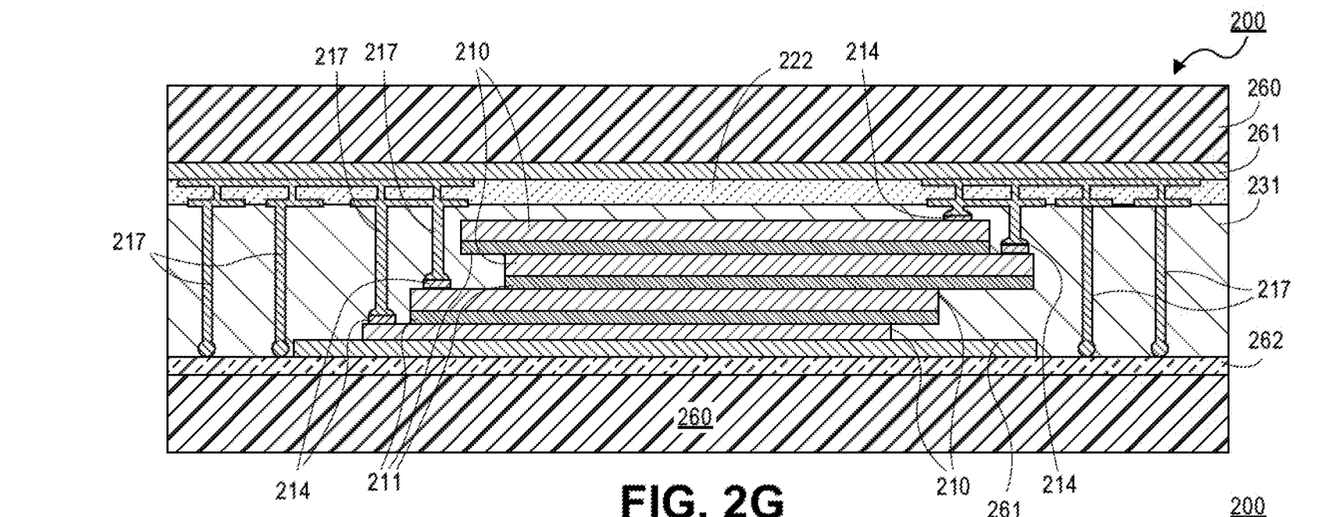

Referring now to FIG. 2G, a cross-sectional illustration of a semiconductor package 200 with a carrier 260 (a second carrier) and an adhesive layer 261 is shown, in accordance with an embodiment. In one embodiment, the semiconductor package 200 may include the carrier 260 and the adhesive layer 261, respectively, coupled to the top surface of the RDL 222.

Figure 2H:
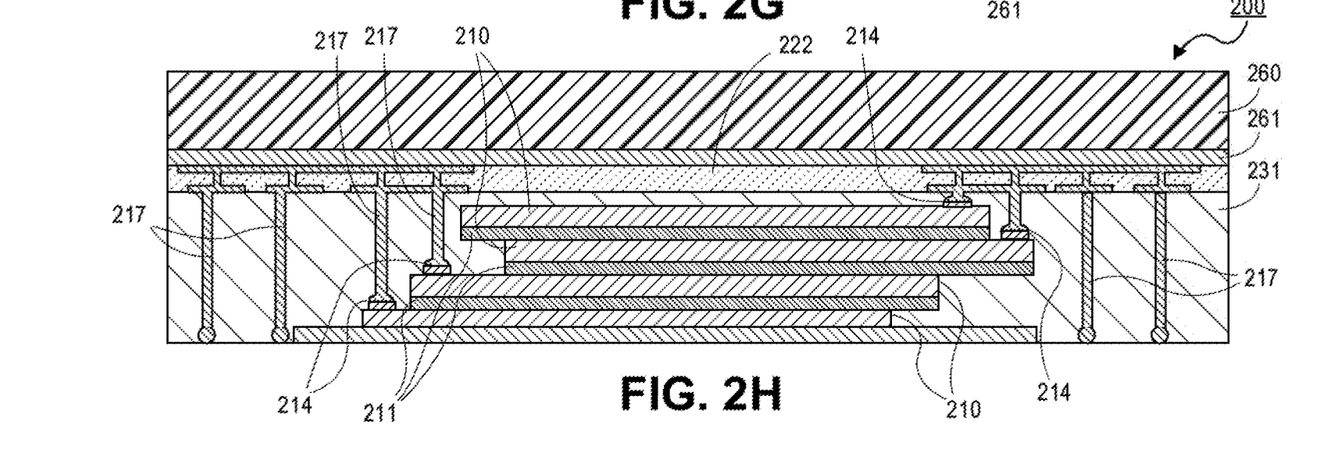

Referring now to FIG. 2H, a cross-sectional illustration of a semiconductor package 200 is shown after the removal of the first carrier and the conductive layer, in accordance with an embodiment. In one embodiment, the semiconductor package 200 may include removing the carrier and the conductive layer to expose the bottom surfaces of the mold layer 231, the interconnects 217, and the adhesive layer 261.

Figure 2I:
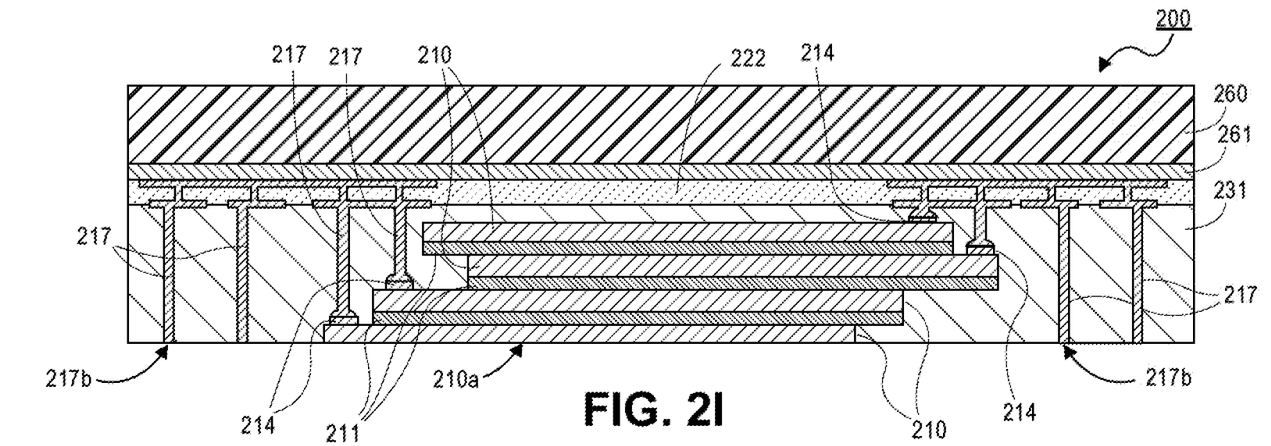

Referring now to FIG. 2I, a cross-sectional illustration of a semiconductor package 200 with bottom surfaces 217b of the interconnects 217 and a bottom surface 210a of the stacked dies 210 is shown, in accordance with an embodiment. In one embodiment, the semiconductor package 200 may include grinding the mold layer 231 to expose the bottoms surfaces 217b of the interconnects 217, where the adhesive layer 261 is removed to expose the bottom surface 210a of the stacked dies 210.

Figure 2J:
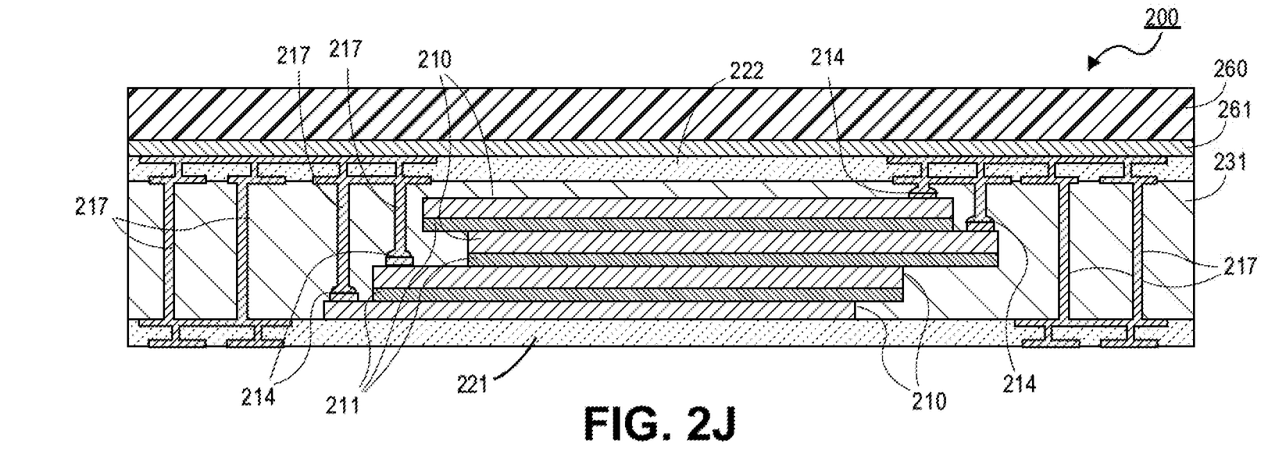

Referring now to FIG. 2J, a cross-sectional illustration of a semiconductor package 200 with a RDL 221 is shown, in accordance with an embodiment. In one embodiment, the semiconductor package 200 may include the RDL 221 disposed below the interconnects 217, the stacked dies 210, and the mold layer 231. The RDL 221 may be substantially similar to the RDL 121 of FIG. 1A. In one embodiment, the RDL 221 is electrically coupled to the interconnects 217 and the RDL 222.

Figure 2K:
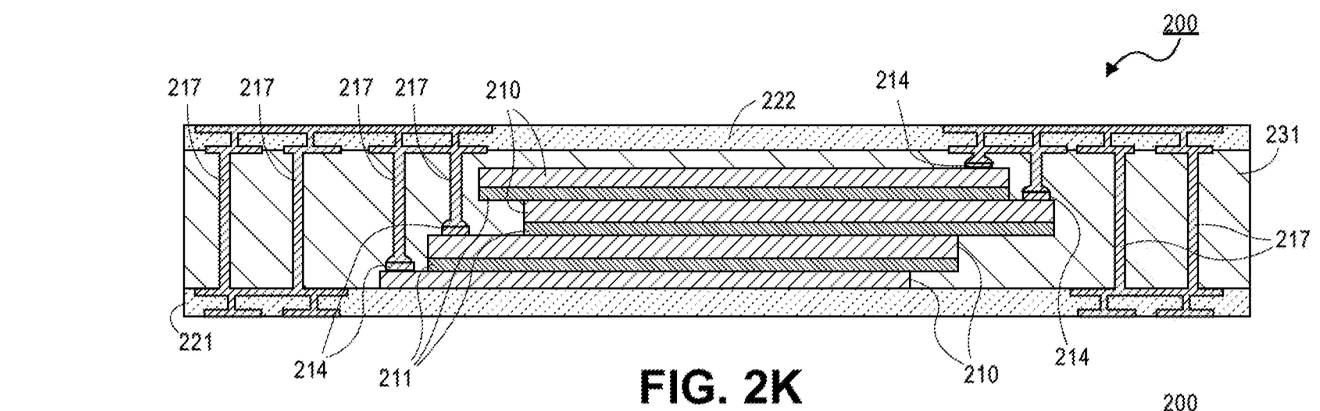
Figure 2L:
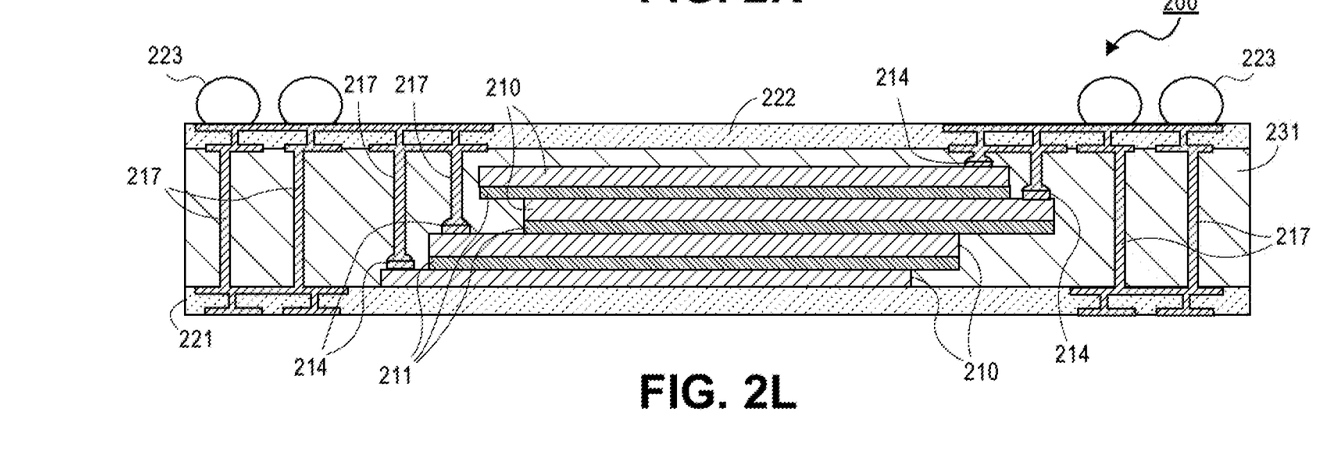

Referring now to FIG. 2K, a cross-sectional illustration of a semiconductor package 200 is shown after the removal of the second carrier and the adhesive layer, in accordance with an embodiment. In one embodiment, the semiconductor package 200 may include removing the carrier and the adhesive layer to expose the top surface of the RDL 222. Note that, after this removal process, the semiconductor package 200 of FIG. 2L is substantially similar to the semiconductor package 100 of FIG. 1A. In some embodiments, the semiconductor package 200 may dispose a plurality of solder balls 223 above the RDL 222 to electrically couple the semiconductor package 200 to another substrate and/or package (e.g., as shown in FIGS. 1B-1C).

Note that package substrate 200 as shown in FIGS. 2A-2L may include fewer or additional packaging components based on the desired packaging design.

Figure 3:
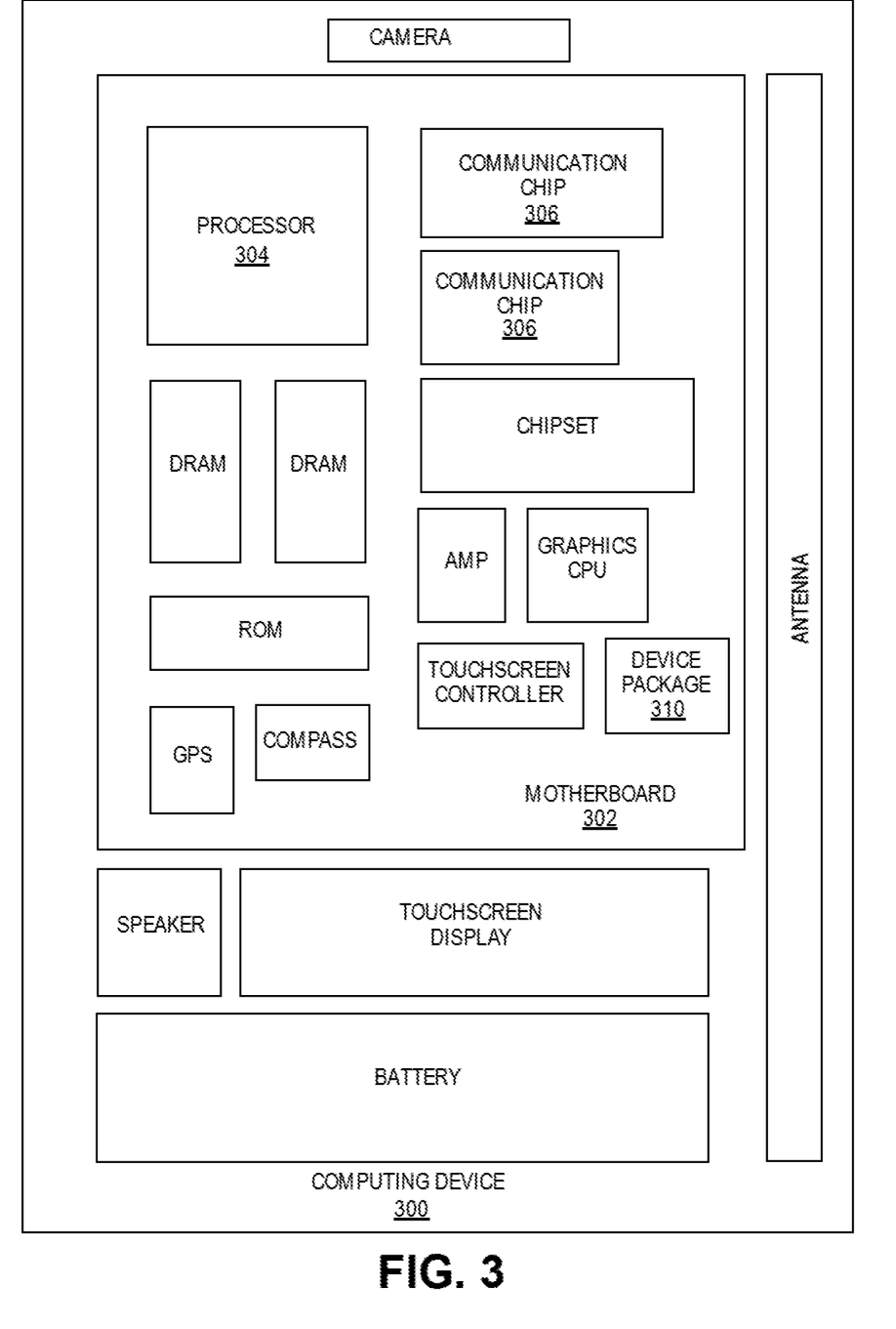
FIG. 3 is an illustration of a schematic block diagram illustrating a computer system that utilizes a semiconductor package having a stack of dies, dual-sided RDLs, and a plurality of interconnects, according to one embodiment.

FIG. 3 is an illustration of a schematic block diagram illustrating a computer system 300 that utilizes a semiconductor package having a stack of dies, dual-sided RDLs, and a plurality of interconnects, according to one embodiment. FIG. 3 illustrates an example of computing device 300. Computing device 300 houses motherboard 302. For one embodiment, motherboard 302 may be similar to the substrate 102 of FIG. 1C. Motherboard 302 may include a number of components, including but not limited to processor 304, device package 310 (or semiconductor package), and at least one communication chip 306. Processor 304 is physically and electrically coupled to motherboard 302. For some embodiments, at least one communication chip 306 is also physically and electrically coupled to motherboard 302. For other embodiments, at least one communication chip 306 is part of processor 304.

Depending on its applications, computing device 300 may include other components that may or may not be physically and electrically coupled to motherboard 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. Device package 310 may be, but is not limited to, a substrate, a package substrate, and/or a PCB. Device package 310 may include a stacked dies package with dual-sided RDLs and vertical wires (e.g., as illustrated in FIGS. 1-2)—or any other components from the figures described herein. The device package 310 may thus implement the semiconductor packages and/or the PoP packages/systems described herein to provide a high I/O count, a high test yield, and a low power loss (e.g., as compared to existing solutions) to the computing device 300.

Note that device package 310 may be a single component/device, a subset of components, and/or an entire system, as the materials, features, and components may be limited to device package 310 and/or any other component of the computing device 300 that may need dual-side RDLs, stacked dies packages using vertical wires/interconnects (e.g., the motherboard 302, the processor 304, and/or any other component of the computing device 300 may need the semiconductor packages (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 306 also includes an integrated circuit die packaged within the communication chip 306. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a first redistribution layer; a stack of dies on the first redistribution layer; a second redistribution layer over the stack of dies and the first redistribution layer; and a plurality of interconnects coupled to the stack of dies and the first and second redistribution layers, wherein the plurality of interconnects extend substantially vertical from a top surface of the first redistribution layer to a bottom surface of the second redistribution layer.

In example 2, the subject matter of example 1 can optionally include a mold layer between the first redistribution layer and the second redistribution layer, wherein the mold layer surrounds the plurality of interconnects and the stack of dies.

In example 3, the subject matter of examples 1-2 can optionally include that the plurality of interconnects are through mold vertical wire interconnects.

In example 4, the subject matter of examples 1-3 can optionally include that the through mold vertical wire interconnects have a diameter of approximately 5 μm to 50 μm.

In example 5, the subject matter of examples 1-4 can optionally include that the first and second redistribution layers are dual-sided redistribution layers.

In example 6, the subject matter of examples 1-5 can optionally include a plurality of adhesive layers coupled to the stack of dies, wherein one or more of the adhesive layers couple the stack of dies to the first redistribution layer or the second redistribution layer.

In example 7, the subject matter of examples 1-6 can optionally include that each die of the stack of dies is positioned on top of another die having an exposed portion of a top surface of each die.

In example 8, the subject matter of examples 1-7 can optionally include that each die of the stack of dies has a conductive pad located on the exposed portion of the top surface of each die, and wherein one or more of the plurality of interconnects couple the conductive pad of each die of the stack of dies to the second redistribution layer.

In example 9, the subject matter of examples 1-8 can optionally include a plurality of solder balls coupled to the first redistribution layer or the second redistribution layer.

Example 10 is a package on package (PoP) system, comprising: a first package on a second package; an electronic component on the first package; and a plurality of first solder balls between the first package and the second package, wherein the plurality of first solder balls couples the first package to the second package, and wherein each of the first and second packages includes a first redistribution layer; a stack of dies on the first redistribution layer; a second redistribution layer over the stack of dies and the first redistribution layer; and a plurality of interconnects coupled to the stack of dies and the first and second redistribution layers, wherein the plurality of interconnects extend substantially vertical from a top surface of the first redistribution layer to a bottom surface of the second redistribution layer.

In example 11, the subject matter of example 10 can optionally include a mold layer between the first redistribution layer and the second redistribution layer, wherein the mold layer surrounds the plurality of interconnects and the stack of dies.

In example 12, the subject matter of examples 10-11 can optionally include that the plurality of stacked semiconductor packages are disposed vertically on top each other substantially with no offset.

In example 13, the subject matter of examples 10-12 can optionally include that the plurality of interconnects are through mold vertical wire interconnects.

In example 14, the subject matter of examples 10-13 can optionally include that the through mold vertical wire interconnects have a diameter of approximately 5 μm to 50 μm.

In example 15, the subject matter of examples 10-14 can optionally include that the first and second redistribution layers are dual-sided redistribution layers.

In example 16, the subject matter of examples 10-15 can optionally include a plurality of adhesive layers coupled to the stack of dies, wherein one or more of the adhesive layers couple the stack of dies to the first redistribution layer or the second redistribution layer.

In example 17, the subject matter of examples 10-16 can optionally include that each die of the stack of dies is positioned on top of another die having an exposed portion of a top surface of each die, and wherein one or more of the plurality of interconnects couple the conductive pad of each die of the stack of dies to the second redistribution layer.

In example 18, the subject matter of examples 10-17 can optionally include that each die of the stack of dies has a conductive pad located on the exposed portion of the top surface of each die.

In example 19, the subject matter of examples 10-18 can optionally include a substrate; and a third package on a fourth package, wherein a plurality of second solder balls couples the second package onto the third package, wherein a plurality of third solder balls couples the third package onto the fourth package, wherein a plurality of fourth solder balls couples the fourth package onto the substrate, wherein the first, second, third, and fourth packages are disposed vertically on top each other substantially with no offset, and wherein each of the third and fourth packages includes a first redistribution layer; a stack of dies on the first redistribution layer; a second redistribution layer over the stack of dies and the first redistribution layer; and a plurality of interconnects coupled to the stack of dies and the first and second redistribution layers, wherein the plurality of interconnects extend substantially vertical from a top surface of the first redistribution layer to a bottom surface of the second redistribution layer.

Example 20 is a method of forming a semiconductor package, comprising: disposing a stack of dies on a first redistribution layer; disposing a second redistribution layer over the stack of dies and the first redistribution layer; and coupling a plurality of interconnects to the stack of dies and the first and second redistribution layers, wherein the plurality of interconnects extend substantially vertical from a top surface of the first redistribution layer to a bottom surface of the second redistribution layer.

In example 21, the subject matter of example 20 can optionally include disposing a mold layer between the first redistribution layer and the second redistribution layer, wherein the mold layer surrounds the plurality of interconnects and the stack of dies.

In example 22, the subject matter of examples 20-21 can optionally include that the plurality of interconnects are through mold vertical wire interconnects, wherein the first and second redistribution layers are dual-sided redistribution layers, and wherein each die of the stack of dies is positioned on top of another die having an exposed portion of a top surface of each die.

In example 23, the subject matter of examples 20-22 can optionally include that the through mold vertical wire interconnects have a diameter of approximately 5 μm to 50 μm.

In example 24, the subject matter of examples 20-23 can optionally include coupling a plurality of adhesive layers to the stack of dies, wherein one or more of the adhesive layers couple the stack of dies to the first redistribution layer or the second redistribution layer; and coupling a plurality of solder balls to the first redistribution layer or the second redistribution layer.

In example 25, the subject matter of examples 20-24 can optionally include that each die of the stack of dies has a conductive pad located on the exposed portion of the top surface of each die, and wherein one or more of the plurality of interconnects couple the conductive pad of each die of the stack of dies to the second redistribution layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package on package (PoP) system, comprising:
   a first package on a second package;
   an electronic component on the first package; and
   a plurality of first solder balls between the first package and the second package, wherein the plurality of first solder balls couples the first package to the second package, and wherein each of the first package and the second package includes
      a first redistribution layer;
      a stack of dies on the first redistribution layer;
      a second redistribution layer over the stack of dies and the first redistribution layer;
      a plurality of interconnects, wherein first ones of the plurality of interconnects extend substantially vertical from a top surface of the first redistribution layer to a bottom surface of the second redistribution layer, wherein the first ones of the plurality of interconnects are laterally spaced apart from the stack of dies, wherein second ones of the plurality of interconnects extend from a corresponding one of the stack of dies to the bottom surface of the redistribution layer, and wherein a first portion of the second ones of the plurality of interconnects are adjacent to a first side of the stack of dies, and a second portion of the second ones of the plurality of interconnects are adjacent to a second side of the stack of dies, the second side laterally opposite to the first side;
      a mold layer between the first redistribution layer and the second redistribution layer, a portion of the mold layer vertically between an uppermost surface of the stack of dies and the bottom surface of the second redistribution layer, wherein the first ones of the plurality of interconnects extending from the first redistribution layer to the second redistribution layer are in direct contact with the mold layer, and wherein the first ones of the plurality of interconnects extending from the first redistribution layer to the second redistribution layer have an uppermost surface at same level as an uppermost surface of the mold layer,
   a substrate; and
   a third package on a fourth package, wherein a plurality of second solder balls couples the second package onto the third package, wherein a plurality of third solder balls couples the third package onto the fourth package, wherein a plurality of fourth solder balls couples the fourth package onto the substrate, wherein the first, second, third, and fourth packages are disposed vertically on top each other substantially with no offset, and wherein each of the third package and the fourth package includes
      a first redistribution layer;
      a stack of dies on the first redistribution layer;
      a second redistribution layer over the stack of dies and the first redistribution layer; and
      a plurality of interconnects coupled to the stack of dies and the first and second redistribution layers, wherein the plurality of interconnects extend substantially vertical from a top surface of the first redistribution layer to a bottom surface of the second redistribution layer.

2. The PoP system of claim 1, wherein the mold layer surrounds the plurality of interconnects and the stack of dies, and wherein the stack of dies include two or more dies stacked on top of each other.

3. The PoP system of claim 1, wherein the electrical component is on a top surface of the second redistribution layer of the first package.

4. The PoP system of claim 1, wherein the plurality of interconnects are through mold vertical wire interconnects.

5. The PoP system of claim 4, wherein the through mold vertical wire interconnects have a diameter of approximately 5 µm to 50 µm.

6. The PoP system of claim 1, wherein the first redistribution layer and the second redistribution layer are first and second dual-sided redistribution layers.

7. The PoP system of claim 1, further comprising a plurality of adhesive layers coupled to the stack of dies, wherein one or more of the adhesive layers couple the stack of dies to the first redistribution layer or the second redistribution layer.

8. The PoP system of claim 1, wherein each die of the stack of dies is positioned on top of another die having an exposed portion of a top surface of each die, and wherein one or more of the plurality of interconnects couple the conductive pad of each die of the stack of dies to the second redistribution layer.

9. The PoP system of claim 8, wherein each die of the stack of dies has a conductive pad located on the exposed portion of the top surface of each die.

10. A package on package (PoP) system, comprising:
a first package on a second package;
an electronic component on the first package; and
a plurality of first solder balls between the first package and the second package, wherein the plurality of first solder balls couples the first package to the second package, and wherein each of the first package and the second package includes
a first redistribution layer;
a stack of dies on the first redistribution layer;
a second redistribution layer over the stack of dies and the first redistribution layer;
a plurality of interconnects coupled to the stack of dies and the first redistribution layer and the second redistribution layer, wherein ones of the plurality of interconnects extend substantially vertical from a top surface of the first redistribution layer to a bottom surface of the second redistribution layer, and wherein the ones of the plurality of interconnects are laterally spaced apart from the stack of dies;
a mold layer between the first redistribution layer and the second redistribution layer, a portion of the mold layer vertically between an uppermost surface of the stack of dies and the bottom surface of the second redistribution layer, wherein the ones of the plurality of interconnects extending from the first redistribution layer to the second redistribution layer are in direct contact with the mold layer, and wherein the ones of the plurality of interconnects extending from the first redistribution layer to the second redistribution layer have an uppermost surface at same level as an uppermost surface of the mold layer;
a substrate; and
a third package on a fourth package, wherein a plurality of second solder balls couples the second package onto the third package, wherein a plurality of third solder balls couples the third package onto the fourth package, wherein a plurality of fourth solder balls couples the fourth package onto the substrate, wherein the first, second, third, and fourth packages are disposed vertically on top each other substantially with no offset, and wherein each of the third package and the fourth package includes:
a first redistribution layer;
a stack of dies on the first redistribution layer;
a second redistribution layer over the stack of dies and the first redistribution layer; and
a plurality of interconnects coupled to the stack of dies and the first and second redistribution layers, wherein the plurality of interconnects extend substantially vertical from a top surface of the first redistribution layer to a bottom surface of the second redistribution layer.

* * * * *